United States Patent [19]

Podlaseck et al.

[11] Patent Number: 5,545,474
[45] Date of Patent: Aug. 13, 1996

[54] ELECTROMAGNETIC-ATTENUATING COATING MATERIALS

[75] Inventors: Stanley Podlaseck; Gene P. Shumaker; Paul D. Rimer, all of Orlando, Fla.

[73] Assignee: Martin Marietta Corporation, Bethesda, Md.

[21] Appl. No.: 203,625

[22] Filed: Mar. 1, 1994

[51] Int. Cl.$^6$ ................................................. B32B 5/16
[52] U.S. Cl. ........................ 428/288; 252/502; 428/323; 428/325; 428/331; 428/368; 428/375; 428/381; 428/388; 428/391; 428/931; 523/137; 523/351; 524/495; 524/496
[58] Field of Search .................... 428/288, 931, 428/375, 323, 325, 331, 368, 381, 388, 391; 252/502; 523/137, 351; 524/495, 496

[56] References Cited

U.S. PATENT DOCUMENTS

| | | | |
|---|---|---|---|
| 2,923,934 | 2/1960 | Halpern | 343/18 |
| 2,929,436 | 3/1960 | Hampshire | 154/1 |
| 3,599,210 | 8/1971 | Stander | 343/18 A |
| 3,843,593 | 10/1974 | Shell et al. | 260/40 R |
| 4,325,849 | 4/1982 | Rosen et al. | 252/62 |
| 4,360,440 | 11/1982 | Boyer et al. | 252/62 |
| 4,429,216 | 1/1984 | Brigham | 219/528 |
| 4,474,685 | 10/1984 | Annis | 252/503 |
| 4,534,998 | 8/1985 | DuPont et al. | 427/122 |
| 4,569,786 | 2/1986 | Deguchi | 252/503 |
| 4,610,808 | 9/1986 | Kleiner | 252/512 |
| 4,664,971 | 5/1987 | Soens | 428/288 |
| 4,678,699 | 7/1987 | Kritchevsky et al. | 428/175 |
| 4,738,896 | 4/1988 | Stevens | 428/315.9 |
| 4,759,950 | 7/1988 | Stevens | 427/55 |
| 4,789,563 | 12/1988 | Stevens | 427/252 |
| 4,839,402 | 6/1989 | Stevens | 523/200 |
| 4,862,713 | 9/1989 | Kutz et al. | 68/21 |
| 4,935,296 | 6/1990 | Stevens | 428/288 |
| 4,973,514 | 11/1990 | Gamble et al. | 428/297 |
| 4,983,456 | 1/1991 | Iwaskow et al. | 428/254 |
| 5,061,566 | 10/1991 | Morgan | 428/423.1 |
| 5,089,326 | 2/1992 | Bonazza | 428/284 |
| 5,210,116 | 5/1993 | Hashimoto et al. | 523/468 |
| 5,312,678 | 5/1994 | McCullough, Jr. et al. | 428/225 |

*Primary Examiner*—D. S. Nakarani
*Attorney, Agent, or Firm*—Burns, Doane, Swecker & Mathis

[57] ABSTRACT

An electromagnetic-attenuating coating having fibers uniformly dispersed in a lightly loaded dielectric matrix material. The fibers are metal-coated dielectric or semi-conductive fibers such as graphite fibers and the fibers are provided in an amount of less than 1 weight % of the coating. The dielectric matrix material is a resin material such as silicone. The fiber lengths and diameters, the material of the fibers and metal coating, the thickness and tolerance range of the metal coating and the loading of the metal coated fibers in the matrix material can be adjusted depending on the frequency range to be attenuated.

10 Claims, No Drawings

ELECTROMAGNETIC-ATTENUATING COATING MATERIALS

FIELD OF THE INVENTION

The present invention relates to electromagnetic-attenuating coating materials.

This invention was made with Government support under Contract No. N00014-89-C-2221 awards by the Department of Defense. The Government has certain rights in this invention.

BACKGROUND OF THE INVENTION

Electromagnetic interference (EMI) shielding materials are disclosed in U.S. Pat. Nos. 4,935,296 and 5,089,326. The '296 patent discloses a composite containing an EMI shieldingly effective amount of metal-coated fibers and details of such fibers can be found in U.S. Pat. Nos. 4,738,896; 4,759,950; 4,789,563 and 4,839,402.

Radar absorptive coating materials are disclosed in U.S. Pat. Nos. 3,599,210 and 3,843,593. The '210 patent discloses a coating containing fibers cut to a length of one-half wavelength of the anticipated radar frequency with the fibers being insulated along their lengths by thinly bonding a dielectric, low loss material such as untilled epoxy, pure resin or varnish and the fibers are randomly dispersed within a solid matrix of resinous material. The '593 patent discloses a coating containing iron pigment in a resin matrix.

U.S. Pat. No. 4,983,456 discloses electrically conductive laminates, conductive coatings, conductive adhesives, conductive inks, conductive gaskets and conductive caulking and sealing compounds wherein metal coated fibers are utilized. The '456 patent further discloses polymeric material convertible by heat or light, alone or in combination with catalysts, accelerators, cross-linking agents, etc., can be combined with the composite fibers. The fibers include a semi-metallic core made of carbon, boron or silicon carbide and an electrically and/or thermally conductive layer of at least one electro-depositable metal such as nickel, silver, zinc, copper, lead, arsenic, cadmium, tin, cobalt, gold, indium, iridium, iron, palladium, platinum, tellurium, or mixtures thereof.

The following U.S. patents relate generally to methods of mixing filler or fibers and resin and/or applying a mixture of resin and filler/fiber material onto a substrate. The patents include U.S. Pat. Nos. 2,923,934; 2,929,436; 3,599,210; 4,325,849; 4,360,440; 4,474,685; 4,534,998; 4,862,713; 4,935,296; and 4,983,456. The foregoing patents, however, fail to appreciate the importance of avoiding breakage of fibers during mixing of the fibers with a resin matrix and during applying the mixture to a substrate. For instance, with respect to electromagnetic attenuating materials, such breakage could result in fibers having lengths that reduce, and conceivably even eliminate the desired electromagnetic attenuating property.

SUMMARY OF THE INVENTION

The invention provides an electromagnetic attenuating coating comprising fibers are present in an amount effective to provide electromagnetic attenuation a dielectric matrix material. The fibers comprise metal coated dielectric or semiconductive fibers whereas the dielectric matrix material comprises a resin material.

According to various features of the invention, the fibers can be selected from the group consisting of glass, fused silica, silicon carbide and graphite fibers. The fibers preferably have a uniform diameter, a circular cross-section, a rectilinear shape, a smooth exterior surface and a diameter of 4–20 microns ($\mu m$). For instance, the fibers can be rectilinear nickel-coated graphite fibers. The fibers are preferably uniformly dispersed in the resin and can comprise less than 1 weight percent of the coating. In an exemplary embodiment of the invention, the fibers can comprise less than 0.2 % by weight of the matrix. The resin can comprise a thermosetting plastic material such as a polymer material or a synthetic resin. The resin is preferably a non-thermoplastic material.

DETAILED DESCRIPTION OF THE INVENTION

According to the invention, an electromagnetic attenuating coating includes metal-coated dielectric or semiconductive fibers in a lightly loaded resin material. The metal-coated fibers can be dispersed uniformly so as to give a controlled and repeatable electromagnetic attenuating property.

Over the past several years, stainless steel fibers available in 4–20-micron effective diameters have been the fiber of choice in many artificial dielectric-coating designs. These fibers have been selected because of their electrical conductivity and low cost. In addition, they are readily available in a variety of diameters. To date, unfortunately, a successful technique has not been found for dispersing the stainless steel fibers in a resin binder such that the electrical performance of the coating is predictable, repeatable and consistent. The electromagnetic attenuating coating of the present invention overcomes these problems.

According to the invention, it has been discovered that metal-coated dielectric or semi-conductive fibers can approximate the electrical conductivity of an equivalent-diameter stainless steel fiber and the resulting artificial dielectric coating can be applied repeatedly and consistently, in a manner which yields the desired electrical performance. Although the metal-coated fibers are slightly more costly than the stainless steel fibers, their concentration in the coating can be adjusted such that the cost of the coating does not vary significantly from a stainless-steel-fiber-containing coating. The metal-coated fibers also offer additional advantages such as the ability to tailor larger and smaller diameter fibers to achieve a broad range of conductivities.

The artificial dielectric coatings according to the invention utilize a uniform dispersion of fibers in a resin matrix, the fibers having uniform, discrete lengths, diameters and electrical conductivities. Whereas metallic fibers suffer agglomeration and clumping problems leading to lack of consistency and repeatability in their electrical performance, the metal-coated fibers according to the invention disperse uniformly and give predictable and repeatable electrical performance.

The fibers used in the coating according to the invention can be selected from the group consisting of glass, fused silica, silicon carbide and graphite fibers. For instance, the fibers can be commercially available graphite fibers such as Hercules type AS-4 or Amoco products type T-300 fibers. The metal coating can be any suitable metal such as nickel and the metal can be applied to the fibers by any suitable technique such as by chemical vapor deposition. The metal coating should have a thickness sufficient to approximate the electrical conductivity of an equivalent-diameter stainless steel fiber. U.S. Pat. Nos. 4,738,896; 4,759,950; 4,789,563; 4,839,402; and 4,935,296, the disclosures of which are hereby incorporated by reference, disclose techniques for preparing metal-coated fibers which can be used in the coating of the present invention.

According to the invention, the lengths and diameters of the metal-coated fibers, the coating thickness, the range of tolerance of the metal-coating thickness on the fibers, the amount of fibers loaded into the matrix and materials used for the fibers and metal coating on the fibers will determine the range of frequencies which can be attenuated by the electromagnetic-attenuating coating of the invention. The selection of the above parameters for attenuating a particular frequency range will be apparent to persons skilled in the art.

According to one aspect of the invention, the fibers are uniformly dispersed in a lightly loaded dielectric matrix material. The matrix material comprises a resin material which preferably is a non-thermoplastic material. For instance, the resin can comprise a thermosetting polymer material such as silicone.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An electromagnetic-attenuating coating on a substrate, the coating comprising fibers uniformly dispersed in a dielectric thermosetting polymer matrix material, the fibers being present in an amount of less than 0.2 wt % of the coating and being effective to provide electromagnetic attenuation, said fibers comprising metal-coated dielectric or semiconductive fibers.

2. The coating of claim 1, wherein the fibers are selected from the group consisting of glass, fused silica, silicon carbide and graphite fibers.

3. The coating of claim 1, wherein the fibers have a uniform diameter.

4. The coating of claim 1, wherein the fibers have a circular cross section.

5. The coating of claim 1, wherein the fibers are rectilinear in shape.

6. The coating of claim 1, wherein the metal coating on each of the fibers has a uniform thickness.

7. The coating of claim 1, wherein the fibers are rectilinear graphite fibers.

8. The coating of claim 1, wherein the fibers have a diameter of 4 to 20 μm.

9. The coating of claim 1, wherein the fibers are nickel coated graphite fibers.

10. The coating of claim 1, wherein the thermosetting polymer is a silicone resin.

* * * * *

UNITED STATES PATENT AND TRADEMARK OFFICE
CERTIFICATE OF CORRECTION

PATENT NO. : 5,545,474
DATED : August 13, 1996
INVENTOR(S) : Podlaseck et al.

It is certified that error appears in the above-indentified patent and that said Letters Patent is hereby corrected as shown below:

Column 1, line 9, "awards" should be --awarded--.

line 27, "untilled" should be --unfilled--.

Signed and Sealed this

Twenty-fifth Day of February, 1997

Attest:

BRUCE LEHMAN

*Attesting Officer*  *Commissioner of Patents and Trademarks*